(12) United States Patent
Kitabayashi

(10) Patent No.: US 7,986,089 B2
(45) Date of Patent: Jul. 26, 2011

(54) LIGHT EMITTING DEVICE AND ELECTRONIC APPARATUS

(75) Inventor: Atsushi Kitabayashi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 115 days.

(21) Appl. No.: 12/362,015

(22) Filed: Jan. 29, 2009

(65) Prior Publication Data

US 2009/0195144 A1 Aug. 6, 2009

(30) Foreign Application Priority Data

Feb. 5, 2008 (JP) .................................. 2008-024957

(51) Int. Cl.
*H01J 1/62* (2006.01)

(52) U.S. Cl. ........ 313/503; 313/500; 313/504; 313/505; 313/506

(58) Field of Classification Search .......... 313/495–512; 315/169.3, 169.4; 257/40, 79; 428/690, 428/917; 345/30, 36, 44, 45; 252/72, 181.1, 252/194

See application file for complete search history.

(56) References Cited

U.S. PATENT DOCUMENTS

| | | | |
|---|---|---|---|
| 7,503,823 B2 | 3/2009 | Hashimoto et al. | |
| 7,508,126 B2 | 3/2009 | Miyagawa | |
| 2002/0015110 A1* | 2/2002 | Brown | 348/589 |
| 2005/0001542 A1* | 1/2005 | Kiguchi | 313/504 |
| 2007/0252518 A1 | 11/2007 | Lee et al. | |
| 2009/0253331 A1 | 10/2009 | Hashimoto et al. | |

FOREIGN PATENT DOCUMENTS

| | | |
|---|---|---|
| JP | A-2001-185354 | 7/2001 |
| JP | A-2003-203770 | 7/2003 |
| JP | A-2005-203351 | 7/2005 |
| JP | A-2007-188862 | 7/2007 |
| JP | A-2007-299741 | 11/2007 |
| WO | WO 2007-128971 A2 | 11/2007 |

* cited by examiner

Primary Examiner — Bumsuk Won
Assistant Examiner — Elmito Breval
(74) Attorney, Agent, or Firm — Oliff & Berridge, PLC

(57) ABSTRACT

A light emitting device includes a substrate, a plurality of light emitting elements that is formed on the substrate, and a partition wall layer that is formed on the substrate so as to form a plurality of opening parts in the plan view. Each of the plurality of light emitting elements includes a pixel electrode, an opposing electrode, and a light emitting function layer interposed between the pixel electrode and the opposing electrode. One of the light emitting function layers is formed to be assigned to each of the plurality of opening parts, and a plurality of the pixel electrodes is formed to be fitted into each of the plurality of opening parts. One pixel of the light emitting device includes the light emitting element that includes at least one of the pixel electrodes fitted into one of the plurality of opening parts, and at least one of the pixel electrodes that is fitted into the one of the plurality of opening parts that is adjacent to each other.

6 Claims, 11 Drawing Sheets

= OPENING PART CORRESPONDING TO RED COLOR

= OPENING PART CORRESPONDING TO GREEN COLOR

= OPENING PART CORRESPONDING TO BLUE COLOR

LIGHT EMITTING DEVICE AND ELECTRONIC APPARATUS

BACKGROUND

1. Technical Field

The present invention relates to a light emitting device that emits light by using electroluminescence and an electronic apparatus.

2. Related Art

As a light emission source that is a thin type and is light-weighted, an OLED (organic light emitting diode), that is, an organic EL (electro luminescent) element is provided. The organic EL element has a structure in which an organic thin film of at least one layer formed of an organic material is interposed between a pixel electrode and an opposing electrode. When a current flows between both the electrodes, a current simultaneously flows through the organic thin film, and thereby, the organic thin film or the organic EL element emits light.

When a plurality of the organic EL elements is aligned and emission or non-emission of each of the organic EL elements is appropriately controlled, an image or the like having desired meaning and content can be displayed.

As the above-described organic EL element or an image display apparatus having the organic EL element, for example, an apparatus disclosed in JP-A-2001-185354 has been known.

Generally, the above-described image display apparatus is required to have a definition as high as possible. However, in order to satisfy this requirement, there is a problem that it is difficult to manufacture the image display apparatus. High definition may include an increase in the arrangement density of the organic EL elements. However, in such a case, elements such as the pixel electrode and the opposing electrode described above are needed to be miniaturized to some degree. In particular, when the above-described organic thin film is formed of a polymer material, the organic thin film may be manufactured by using a liquid droplet coating method (ink jet method). In such a case, the difficulty in manufacture is increased further. The reason is that the liquid droplets or ink that is a raw material should be coated within a very fine space with a precise position adjustment.

In JP-A-2001-185354 described above, technology for configuring an EL layer formed by using an ink jet method to be continuous over a plurality of pixel electrodes (claim 1 of JP-A-2001-185354), and more particularly, technology for forming the EL layer in the shape of "a stripe" or "an oval or a rectangle" has been disclosed (see Abstract, FIG. 1, or the like of JP-A-2001-185354). Accordingly, in the technology disclosed in JP-A-2001-185354, the EL layer can be formed by having an ink head to continuously scan, and thereby a processing time can be shortened (paragraph No. [0010] of JP-A-2001-185354). As a result, according to the technology disclosed in JP-A-2001-185354, the difficulty in manufacture can be relieved in that point of view.

However, there is also a problem in the technology disclosed in JP-A-2001-185354. For example, the above-described EL layer formed over the plurality of pixel electrodes necessarily includes a plurality of pixels therein. However, in JP-A-2001-185354, the EL layer is one continuous layer, and accordingly, there is possibility that each pixel has some influence on other pixels. For example, in the extreme case, when one pixel located in the EL layer emits light, a pixel located next thereto may emit light.

SUMMARY

An advantage of some aspects of the invention is that it provides a light emitting device and an electronic apparatus capable of implementing high definition and easiness in manufacture that are incompatible with each other.

According to a first aspect of the invention, there is provided a light emitting device including: a substrate; a plurality of light emitting elements that is formed on the substrate; and a partition wall layer that is formed on the substrate so as to form a plurality of opening parts in the plan view. Each of the plurality of light emitting elements includes a pixel electrode, an opposing electrode, and a light emitting function layer interposed between the pixel electrode and the opposing electrode. One of the light emitting function layers is formed to be assigned to each of the plurality of opening parts, and a plurality of the pixel electrodes is formed to be fitted into each of the plurality of opening parts. One pixel of the light emitting device includes: the light emitting element that includes at least one of the pixel electrodes fitted into one of the plurality of opening parts; and at least one of the pixel electrodes that is fitted into the one of the plurality of opening parts that is adjacent to each other.

According to the above-described light emitting device, first, a plurality of pixel electrodes or a plurality of light emitting elements is in correspondence with each opening part. In addition, "one pixel" (for example, in a case where the light emitting device constitutes a part of an image display apparatus, represents an area that can be one unit for displaying the image) of the above-described light emitting device, as described above, is configured to include at least two or more light emitting elements that have correspondence relationship with different opening parts. In other words, the "one pixel" is configured so as to be over the plurality of opening parts.

In this point, according to the above-described light emitting device, it is possible to acquire easiness in manufacture of the light emitting device and maintain the definition (that is, the arrangement density of the pixel electrodes) to be high. The reason is that, while one light emitting function layer is formed to be assigned to each opening part into which the plurality of pixel electrodes are fitted, that is, each opening part that can bring a relatively large area, the "one pixel" is configured to use each one of the pixel electrodes as a basic unit. The former allows an easy manufacturing process, and the latter allows acquisition of high definition.

In addition, the reason why a layer having a feature in which a plurality of opening parts are formed in the plan view is named as a partition wall layer is that a state, in which a partition wall is placed between one opening part and an opening part located next thereto, appears in a case where the cross-section of the layer is viewed.

In addition, the light emitting element described here is assumed to be an element in which by allowing a current to flow between the pixel electrode and the opposing electrode, a current flows through the light emitting function layer so as to allow the light emitting function layer to emit light.

In the above-described light emitting device, an electrode separating layer may be further included between the plurality of the pixel electrodes fitted into each of the plurality of opening parts.

In such a case, by including the electrode separating layer, occurrence of mutual interference (or crosstalk) of the plurality of pixel electrodes can be suppressed to be the minimum.

The "light emitting function layer" described here, as described in the following embodiments of the invention, may include various layers such as a hole injection layer and an electron injection layer as a laminated structure, in addition to the light emitting layer that includes an organic EL material. In such a case, the above-described "electrode separating layer" can have a thickness for which separation between, for example, the hole injection layer and adjacent light emitting elements is implemented and the light emitting layer is not separated. In such a case, the advantage of improvement of easiness of manufacture that is one of the above-described advantages according to an embodiment of the invention and the advantage of the above-described suppression of occurrence of mutual interference can be acquired in balance.

In addition, the above-described light emitting device, the light emitting function layer may be configured to be formed by using a liquid droplet coating method.

In such a case, the light emitting function layer can be formed appropriately. In particular, in the above-described light emitting device, as described above, one light emitting function layer is needed to be formed to be assigned to each opening part. Thus, in order to implement the feature, a liquid droplet coating method (ink jet method) is one of the most appropriate methods. The reason is that, basically, ink acquired from dispersing an effective component such as an organic EL material into solvent is only needed to be ejected toward the position of formation of the opening part in a case where the method is used.

In the above-described case, the above-described advantages according to an embodiment of the invention can be acquired at the maximum level. The reason is that ejection of the ink is performed for the number of times corresponding to the number of the opening parts, and, as a result, the light emitting elements corresponding to a number acquired from multiplying the number of the opening parts by the number of pixel electrodes to be fitted into one opening part are formed (in other words, high definition corresponding to the number is implemented).

In addition, in the above-described light emitting device, it may be configured that the plurality of opening parts has a same area, and pitches of arbitrary two of the plurality of opening parts that is adjacent to each other are the same.

In such a case, the entire opening parts have a same area and a same pitch, and accordingly, the above-described advantage of the easiness in manufacture can be acquired more effectively.

In addition, in the case, there is high possibility that evaporation of solvent contained in the ink progresses almost uniformly to the entire surface of the substrate, and accordingly, it is possible to increase the quality of the light emitting device that is manufactured finally or to improve the yield.

In addition, "same" described here includes not only a case of exactly the same but also a case where the areas or the pitches are almost the same.

In addition, in the above-described light emitting device, it may be configured that the plurality of opening parts is divided into a plurality of opening part groups, and the plurality of opening part groups are in correspondence with display light of different colors.

In such a case, for example, when the light emitting device configures a part of an image display apparatus, an image can be displayed in colors.

In addition, the "display light" described here represents light that is emitted, for example, from the light emitting device and is finally perceived in the eyes of an observer. This "display light", and more particularly, the "display light of different colors", for example, can be acquired based on a configuration in which the light emitting function layers for emitting light of different colors are disposed for each opening part group. Alternatively, the "display light of different colors" can be acquired based on a configuration in which the light emitting function layer commonly emits white light and color filters of the colors corresponding to the opening part groups are included.

In addition, in the above-described light emitting device, it may be configured that the plurality of opening parts is aligned along an arrangement having a matrix shape, of the plurality of opening parts, a first opening part group corresponds to the display light of a first color, a second opening part group corresponds to the display light of a second color, and a third opening part group corresponds to the display light of a third color, the opening parts that configure the first opening part group and the opening parts that configure the second opening part group are alternately arranged along the direction of a row of the arrangement having the matrix shape, and the opening parts that configure the third opening part group are arranged along the direction of the row of the arrangement having the matrix shape, and the row is adjacent to the rows in which the opening parts configuring the first and second opening part groups are arranged.

In such a case, typically, for example, it is assumed that a red color is the first color, a green color is the second color, and a blue color is the third color. Hereinafter, for the simplification of description, a description will be made according to this example. In the above-described case, in a row configuring the arrangement having the matrix shape, arrangement of the opening parts of red, green, red, green, red, . . . is formed. In addition, in a row adjacent to the above-described row, for example, arrangement of the opening parts of blue, blue, blue, blue, blue, . . . is formed, In the former, the arrangement of "red, green, red, . . ." embodies one detailed example of the "alternate arrangement"

In addition, according to the regulation for the above-described case, a plurality of the pixel electrodes is placed in each opening part that is represented by "red", "green", or "blue". By forming the above-described status, the "one pixel" can be configured more appropriately. This point will be described again in the embodiment of the invention as below.

In the above-described light emitting device, the opening parts configuring the third opening part group may be arranged along the direction of the row with a pitch that is larger than a pitch of the opening parts in the direction of the row configuring the first and second opening part groups.

In such a case, a description will be made according to the above-described example. In a row, arrangement of the opening parts of red, green, red, green, red, . . . is formed. On the other hand, in a row adjacent to the above-described row, for example, arrangement of the opening parts of blue, [ ], blue, [ ], blue, . . . is formed. In the latter, the symbol "[ ]" represents "no disposition of an opening part", that is, a state in which the surface of the partition wall layer can directly appear. This is because the pitch of the arrangement of the direction of the latter row is larger than that of the direction of the former row (in addition, in the above-described example, in a case where the areas of all the opening parts are the same, when the pitch of the latter arrangement is "1", the pitch of the former arrangement is ½ thereof).

Accordingly, in this case, as is apparent from comparison with the example described in the previous feature, a part corresponding to the symbol "[ ]", is regardless of the light emitting area of the light emitting device, and becomes a so-called "blank space".

The "blank space" may be appropriately used for an area for forming a driving transistor that is used for driving the light emitting element according to an embodiment of the invention or a switching transistor that is responsible for allowing a predetermined current to flow through the pixel electrode or not. Regarding this point, a detailed example as "Modified Example 2" of the embodiment to be described later will be described in detail.

In addition, in the above-described light emitting device having the opening part group, it may be configured that, of the plurality of opening parts, the opening parts configuring a part of the opening parts groups are arranged along the arrangement having the matrix shape, and the opening parts configuring the other part of the opening part groups include a series of the opening parts disposed along the direction of the row of the arrangement having the matrix shape.

In such a case, the opening parts configuring a part of the plurality of the opening part groups are configured to include a series of the opening parts, and accordingly, the above-described advantage of the easiness of manufacture can be acquired more effectively. The reason is that, in this case, the light emitting function layer of the opening part can be formed together in the direction of the row of the arrangement having the matrix shape.

In addition, the "series" described here implies a series for the opening parts configuring a part of the opening part groups that are arranged along the arrangement having the matrix shape. In particular, the "series" includes not only a case of a series for all the opening parts aligned in the direction of the row but also a case of a series for some of the opening parts.

In addition, in the above-described light emitting device, an even number of pixel electrodes may be fitted into each of the plurality of opening parts.

In such a case, the relationship between the opening part and the pixel electrode can be determined as an appropriate one. This point will be described again in the embodiment of the invention to be described later.

In addition, in the above-described light emitting device, four of the pixel electrodes may be fitted into each of the plurality of opening parts.

In such a case, the relationship between the opening part and the pixel electrode can be determined as an appropriate one. This point will be described again in the embodiment of the invention to be described later.

In addition, in the above-described light emitting device, the opening parts may have a shape having no angle in the plan view or have a shape of which all the interior angles are obtuse angles.

In such a case, for example, when the light emitting function layer is formed by using a liquid droplet coating method (ink jet method), the stay of the liquid droplets or the ink droplets within the opening part can be implemented appropriately. In other words, the liquid droplets or the ink droplets have a predetermined surface tension, and thus, for example, in a case where the shape of the opening part is angled, it is difficult to allow the liquid droplets or the ink droplets to be widely penetrated into corner parts. However, in this case, the occurrence of such a problem can be prevented in advance.

According to a second aspect of the invention, there is provided an electronic apparatus including the above-described various light emitting devices.

Since the above-described electronic apparatus includes the above-described various light emitting devices, the electronic apparatus can be manufactured in an easy manner and can display a high-definition image.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described with reference to FIGS. 1 to 6. In these drawings and drawings of FIG. 7 and thereafter to be referred later, each ratio of the sizes of parts may be appropriately changed from its real ratio.

Figure 1:
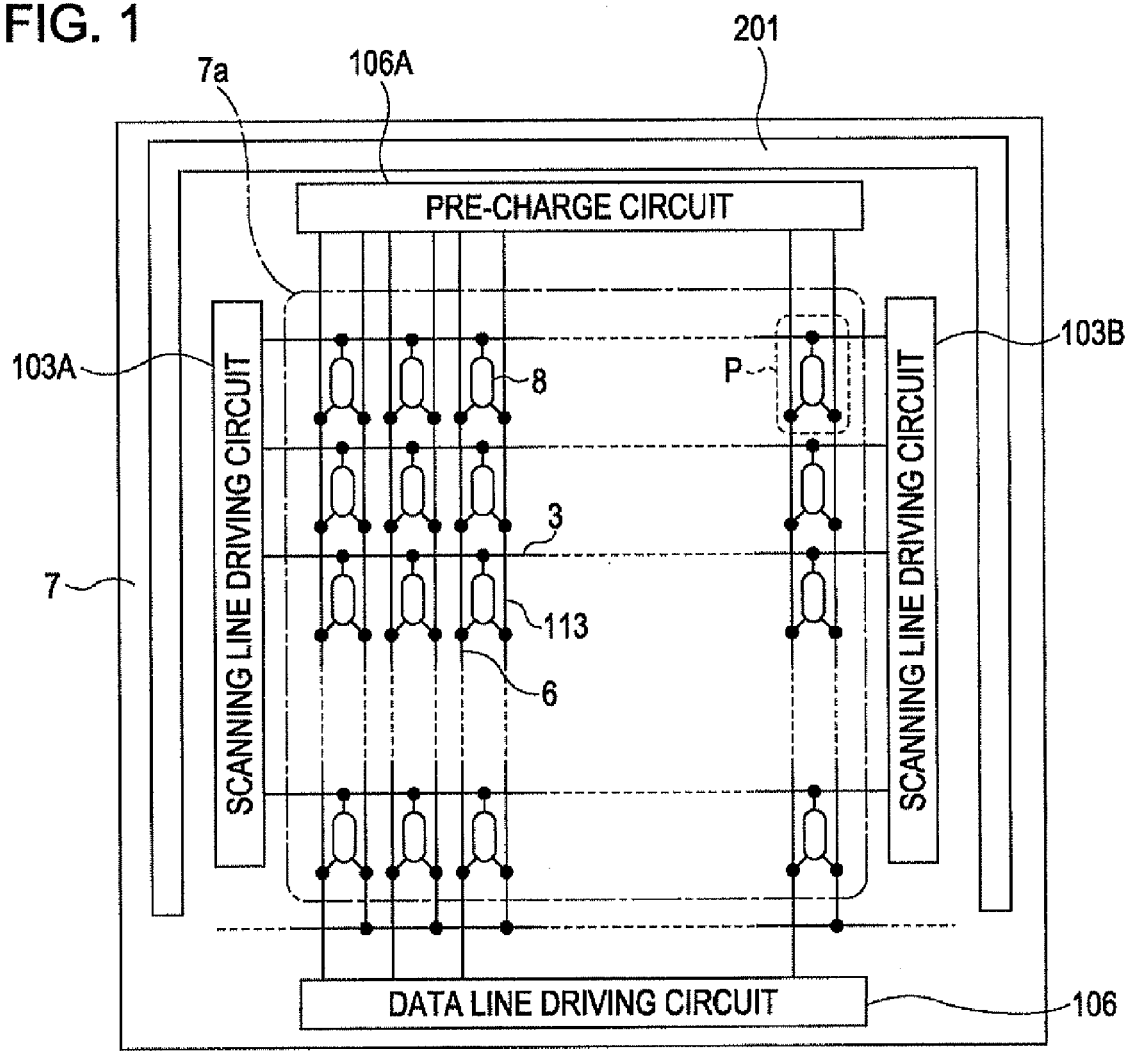
FIG. 1 is a plan view showing a schematic configuration of an organic EL device according to an embodiment of the invention.

FIG. 1 is a plan view showing an example of an organic EL device according to this embodiment.

As shown in FIG. 1, the organic EL device includes a component substrate 7 and various elements that are formed on the component substrate 7. Here, the various elements are an organic EL element 8, scanning lines 3 and data lines 6, scanning line driving circuits 103A and 103B, a data line driving circuit 106, a pre-charge circuit 106A, and an opposing electrode power supply line 201.

A plurality of the organic EL elements (light emitting elements) 8, as shown in FIG. 1, is included on the component substrate 7, and the plurality of the organic EL elements 8 is arranged in a matrix shape. Each organic EL element 8 is configured by a pixel electrode, a light emitting function layer, and an opposing electrode. These elements will be described again later.

An image display area 7*a* is an area in which the plurality of the organic EL elements 8 is arranged on the component substrate 7. In the image display area 7*a*, a desired image can be displayed based on emission and non-emission of the organic EL elements 8. Hereinafter, an area, which is excluded from the image display area 7*a*, of the face of the component substrate 7 is referred to as a peripheral area.

The scanning lines 3 and the data lines 6 are arranged in correspondence with rows and columns of the organic EL elements 8 that are arranged in the matrix shape. In particular, the scanning line 3, as shown in FIG. 1, extends horizontally in the figure and is connected to the scanning line driving circuits 103A and 103B that are formed in the peripheral area. On the other hand, the data line 6 extends vertically in the figure and is connected to the data line driving circuit 106 that is formed in the peripheral area. Near each of intersections of the scanning lines 3 and the data lines 6, a unit circuit (pixel circuit) P including the above-described organic EL element 8 and the like is disposed.

Figure 2:
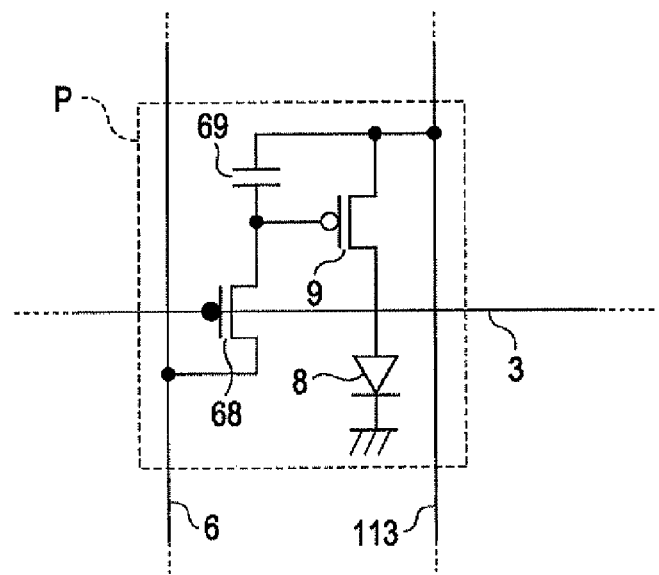
FIG. 2 is a circuit diagram showing a unit circuit P shown in FIG. 1 in detail.

Each unit circuit P, as shown in FIG. 2, includes a first transistor 68 of an n-channel type, a second transistor 9 of a p-channel type, and a capacitor element 69, in addition to the above-described organic EL element 8.

The unit circuit P receives supply of electricity from a current source line 113. A plurality of the current source lines 113 is connected to a power source not shown in the figure.

In addition, the source electrode of the p-channel second transistor 9 is connected to the current source line 113, and the drain electrode of the second transistor 9 is connected to the pixel electrode of the organic EL element 8. Between the source and gate electrodes of the second transistor 9, the capacitor element 69 is disposed. On the other hand, the gate electrode of the n-channel first transistor 68 is connected to the scanning line 3, the source electrode of the first transistor 68 is connected to the data line 6, and the drain electrode of the first transistor 68 is connected to the gate electrode of the second transistor 9.

When the scanning line driving circuits 103A and 103B select a scanning line 3 corresponding to the unit circuit P, the first transistor 68 is turned on, and the unit circuit P maintains a data signal supplied through the data line 6 in the internal capacitor element 69. Then, the second transistor 9 supplies a current corresponding to the level of the data signal to the organic EL element 8. Accordingly, the organic EL element 8 emits light with luminance corresponding to the level of the data signal.

On the peripheral area of the component substrate 7, a pre-charge circuit 106A is disposed. This pre-charge circuit 106A is a circuit that is used for setting the data line 6 to have a predetermined electric potential before a write operation of the data signal into the organic EL element 8 is performed.

The opposing electrode power supply line 201 (hereinafter, simply referred to as a power supply line 201) has the shape of "Π" in the plan view so as to approximately follow the outer contour of the component substrate 7. This power supply line 201 supplies a power source voltage, for example, having a ground level to the opposing electrode of the organic EL element 8.

An example in which all the scanning line driving circuits 103A and 103B, the data line driving circuit 106, and the pre-charge circuit 106A are formed on the component substrate 7 has been described as above. However, all or a part of them may be formed on a flexible substrate in some cases. In such a case, by disposing an appropriate terminal in a portion in which both the flexible substrate and the component substrate 7 are brought into contact with each other, electrical connection therebetween can be implemented.

In particular, the organic EL device having the basic configuration as described above has a structure shown in FIG. 3 or 4.

Figure 3:
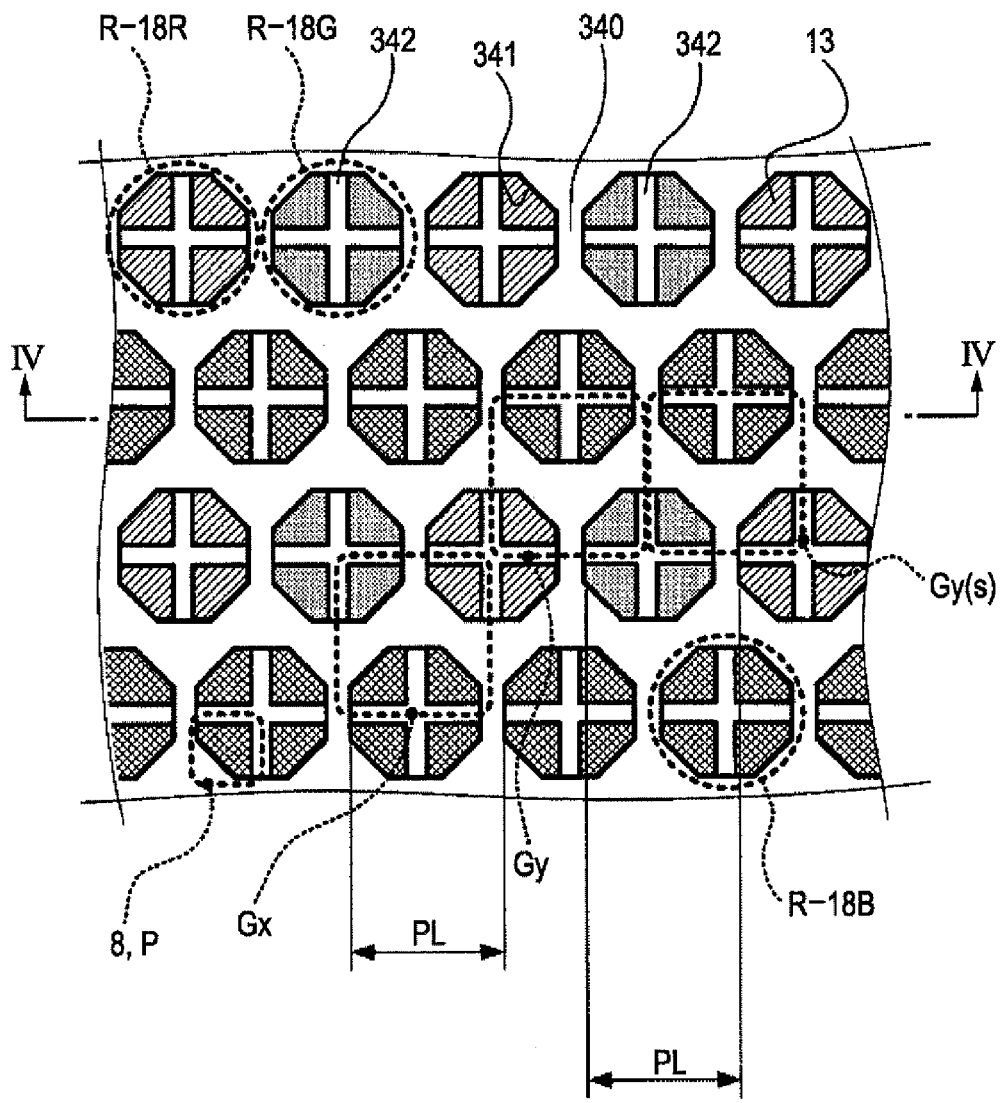
FIG. 3 is an enlarged plan view of a part of an image display area of the organic EL device shown in FIG. 1.
Figure 3:
Figure 3:
Figure 3:

The organic EL device, as shown in FIG. 3, includes a partition wall layer 340 and a plurality of octagon-shaped opening parts 341 that is formed by the partition wall layer 340, as can be viewed when a part of the image display area 7*a* is enlarged.

Figure 4:
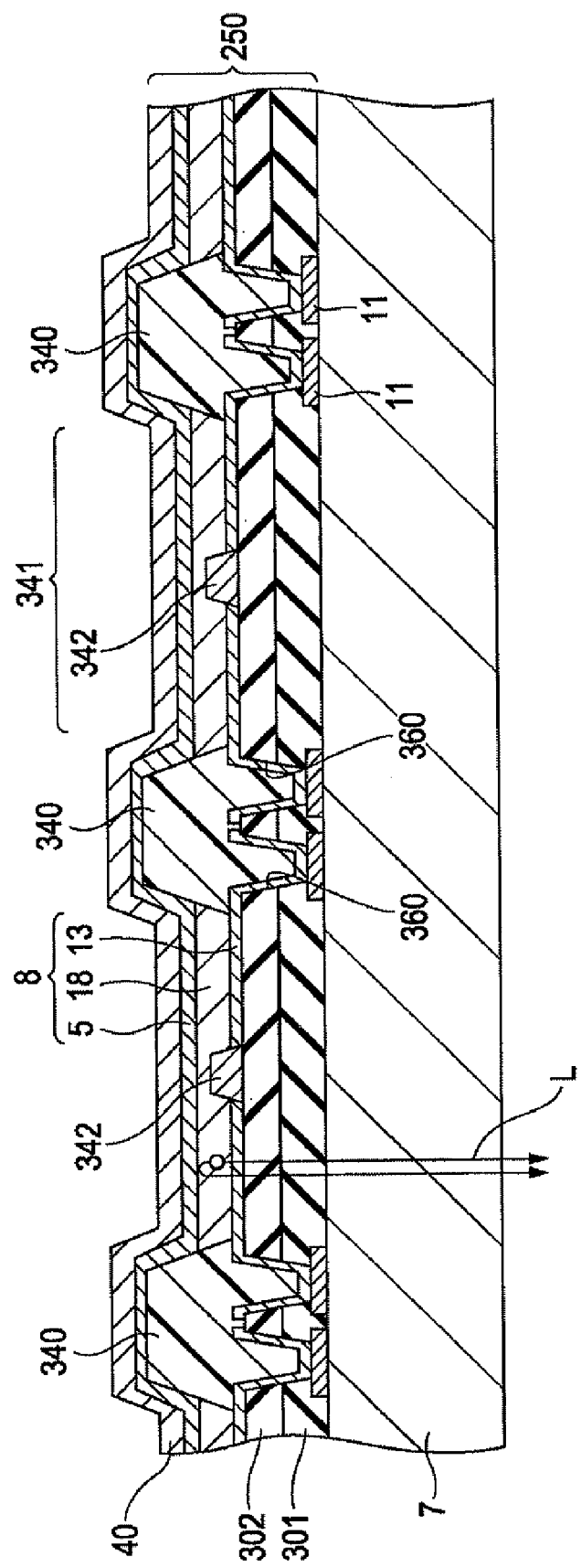
FIG. 4 is a cross-section view taken along line IV-IV shown in FIG. 3 (however, only a part of the line IV-IV is shown).

Among these, the partition wall layer 340, as shown in FIG. 4, constitutes a part of a laminated structure 250. The partition wall layer 340 is formed as an upper layer of a pixel electrode 13 in the figure and is formed such that a contact hole 360 can be buried therein. This partition wall layer 340, for example, is preferably formed of a transparent resin material having the insulating property, and more particularly, a material having liquid repellency. More particularly, the material of the partition wall layer 340 may be fluorinated resin, acrylic resin, epoxy resin, polyimide, or the like.

In addition, when the partition wall layer 340 is formed of the various resin materials, the base layer, for example, is formed of an inorganic material such as $SiO_2$ (in other words, in this case, the partition wall layer 340 has a laminated structure in which an inorganic material is disposed on the lower layer side and an organic material is disposed on the upper layer side). In such a case, even when the pixel electrode 13 is formed of ITO or the like as described later, adhesion between the pixel electrode 13 and the partition wall layer 340 can be increased.

There is the plurality of opening parts 341 as shown in FIG. 3, and the plurality of opening parts 341 is aligned along the arrangement of the matrix shape. This opening part 341, as shown in FIG. 3 or FIG. 4, may be paraphrased as a space surrounded by the partition wall layer 340 (more precisely, the side walls). The bottom face of the opening part 341 coincides with the surface of the pixel electrode 13. In addition, inside the opening part 341, a light emitting function layer 1S, an opposing electrode 5, a barrier layer 40, and the like are included (see FIG. 4).

In each opening part 341, as shown in FIG. 3, four pixel electrodes 13 are fitted. The shape of each pixel electrode 13 in the plan view is approximately a right triangle (however, as is apparent from the figure, the shape of the opening part 341 is an octagon as described above, and accordingly, the shape of the pixel electrode 13 is not a precise right triangle but a shape acquired by cutting away two acute portions from a right triangle). These four pixel electrodes 13 are disposed in one opening part 341 such that right angle portions thereof are approximately adjusted to the center position of the opening part 341.

The pixel electrodes 13 are arranged in one opening part 341 as described above, and the opening parts 341 are arranged in the shape of a matrix as described above. Thereby, the pixel electrodes 13 are also arranged in the shape of a matrix (see FIG. 3).

In addition, the above-described four pixel electrodes 13 are physically separated from one another (see FIG. 4). Among the opening parts 341, the pixel electrodes 13 are separated from one another. The point is that one unit of the pixel electrode 13 is conceived as "one electrode having the shape of an approximate right triangle". Accordingly, one unit of the above-described organic EL element 8 (or the unit circuit P) is determined based on the one unit of the pixel electrode 13 (see reference signs "B" and "P" and a surrounding broken line near the lower left part in FIG. 3).

The pixel electrode 13, as shown in FIG. 4, is electrically connected to a circuit element thin film 11 that constitutes a part of the laminated structure 250 through contact holes 360. The circuit element thin film 11 includes the first transistor 68, the second transistor 9, and the like that are included in the above-described unit circuit P. Although very briefly drawn in the figure, this circuit element thin film 11 is configured by an electrode thin film (all not shown in the figure) that configures a semiconductor layer that constituting the various transistors, a gate insulation film, gate metal, or the capacitor element 69 and other metal thin films. In addition, the contact hole 360 is formed to perforate first and second interlayer insulation films 301 and 302 that constitute a part of the laminated structure 250.

By using the above-described configuration, the pixel electrode 13 can apply a current that is supplied from the current source line 113 through the second transistor 9 to the light emitting function layer 18.

The pixel electrode 13 is formed of a transparent and conductive material such as ITO (Indium Tin Oxide).

In addition, on the inner side of all the opening parts 341, as shown in FIG. 3, an electrode separating layer 342 is formed. The electrode separating layer 342 has a cruciform shape in the plan view, when focused on one opening part 341. This shape is formed along two sides that have the right angle portion of each of the four pixel electrodes 13 interposed therebetween. In other words, the electrode separating layer 342 is disposed so as to separate the four pixel electrodes 13 from one another. The reason why the electrode separating layer 342 has the name of "electrode separating" is focused on the above-described status.

The electrode separating layer 342, as shown in FIG. 4, is positioned as a layer that is the same as the partition wall layer 340. However, the thickness of the electrode separating layer 342 is smaller than that of the partition wall layer 340. In one opening part 341, the light emitting function layer 18 is formed so as to be placed over the electrode separating layers 342, and accordingly, the thickness of a part of the light emitting function layer 18 corresponding to the position in which the electrode separating layer 342 is formed is decreased (see FIG. 4). In this embodiment, the thickness of the electrode separating layer 342 is smaller than that of the partition wall layer 340. However, the electrode separating layer 342 may be configured to have a same thickness as that of the partition wall layer 340. In the viewpoint of simplifying the manufacturing process, it is preferable that the electrode separating layer 342 is formed simultaneously with the partition wall layer 340. At this moment, the width (a distance between adjacent opening parts 341 with a space of the electrode separating layer 342 interposed therebetween) of the electrode separating layer 342 is needed to be smaller than the width (a shortest distance between the adjacent opening parts 341 with a space of the partition wall layer 340 interposed therebetween) of the partition wall layer 340. This is for preventing the forming material of the light emitting function layer from overflowing from the area surrounded by the partition wall layer 340 in the plan view in a case where the adjacent opening parts 341 with the space of the electrode separating layer 342 interposed therebetween are simultaneously coated with the forming material of the light emitting function layer.

In addition, the opening parts 341, as shown in FIG. 3, are divided into an opening part R-18R corresponding to a red color, an opening part R-18G corresponding to a green color, and an opening part R-18B corresponding to a blue color. As is apparent from the figure, there is a plurality of the above-described opening parts 341 (hereinafter, for the simplification of description, the opening part corresponding to the red color is abbreviated to a red opening part, an opening part corresponding to the green color is abbreviated to a green opening part, and an opening part corresponding to the blue color is abbreviated to a blue opening part). Among these, all the plurality of the red opening parts R-18R configures one opening part group according to an embodiment of the invention. This also applies to the green opening part R-18G and the blue opening part R-18B.

In this embodiment, the red opening part R-18R includes an organic light emitting layer including an organic EL material that emits red light as the above-described light emitting function layer 18. Similarly, the green opening part R-18G and the blue opening part R-18B include organic EL materials that emit green light and blue light.

This will be described in more details as below. In other words, in this embodiment, one light emitting function layer 18, as shown in FIG. 3 or 4, is formed to be assigned for each opening part 341. In this embodiment, particularly, the light emitting function layer 18 is formed to be closed in a space that is surrounded by side walls of the partition wall layer 340.

Each light emitting function layer 18 includes at least the organic light emitting layer, and this organic light emitting layer is formed of an organic EL material that emits light by combining holes and electrons. In this embodiment, as the organic EL material, for example, cyanopolyphenylenevinylene that corresponds to red light emission, polyphenylenevinylene that corresponds to green light emission, and polyphenylenevinylene and polyalkylphenylene that correspond to blue light emission may be used (these materials are only examples). Among these, the opening part 341 including the light emitting function layer 18 that includes the foremost material becomes the red opening part R-18R, the opening part 341 including the light emitting function layer 18 that includes the next material becomes the green opening part R-18G, and the opening part 341 including the light emitting function layer 18 that includes the last material becomes the blue opening part R-18B.

The light emitting function layer 18 may be configured to include a part or all of an electron blocking layer, a hole injection layer, a hole transport layer, an electron transport layer, an electron injection layer, and a hole blocking layer.

Any of the above-described layers, the layer can be appropriately formed, for example, by using a liquid droplet coating method (ink jet method) for each opening part 341 in a case where the effective component (the above-described organic EL material for each of the organic light emitting layers) is a high-molecular material such as the above-described polyphenylenevinylene.

In addition, when the light emitting function layer 18 is configured by a plurality of layers as described above to have a laminated structure, the above-described electrode separating layer 342 may be formed to have a thickness for which some of the layers are separated and the other of the layers are not separated. For example, when the light emitting function layer 18 has a laminated structure formed by only the hole injection layer and the organic light emitting layer viewed from the component substrate 7 and the thicknesses of the hole injection layer and the organic light emitting layer are t1 and t2, the thickness of the electrode separating layer 342 may be set to t3 (here, t1≦t3 and t3<t2) or the like. Alternatively, the electrode separating layer 342 may be formed to have a thickness for separating the entire light emitting function layer 18.

The red opening parts R-18R and the green opening parts R-18G, as shown in FIG. 3, are alternately arranged along the direction (horizon direction in the figure) of the row of the arrangement having the above-described matrix shape. In addition, the blue opening parts R-18B are aligned along the direction of a row adjacent to the row in which the red opening parts R-18R and the green opening parts R-18G are aligned. However, the positions of the latter blue opening parts R-18B are deviated from the positions of the former red opening parts R-18R or green opening parts R-18G by a precise half of the width of the opening part 341. In other words, when viewed along the direction of the row of the arrangement having the matrix shape, the blue opening parts R-18B are neither directly adjacent to the red opening parts R-18R nor are directly adjacent to the green opening parts R-18G. The point is that, when viewed with a row used as a reference, the opening parts 341 according to this embodiment are aligned in a zigzag pattern. In the arrangement having the matrix shape according to an embodiment of the invention, such a form is included.

In addition, in this embodiment, all the opening parts 341 have a same area, as is apparent from FIG. 3. In addition, the pitches PL of the opening parts 341 are the same.

Figure 5:
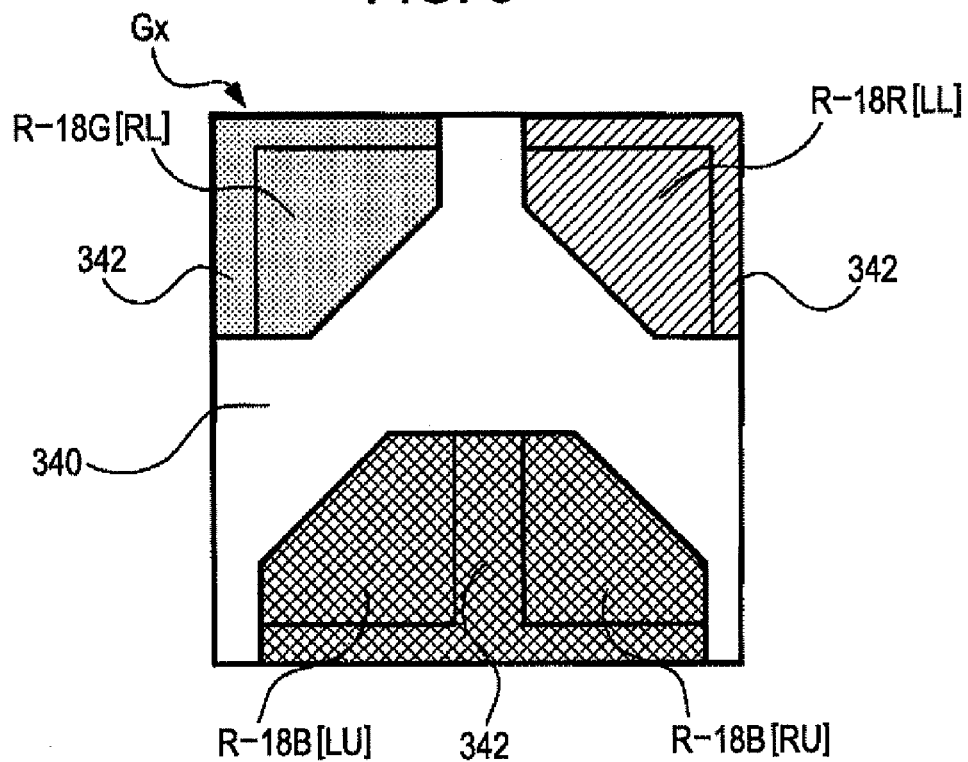
FIG. 5 is an enlarged view of a pixel Gx shown in FIG. 3.
Figure 6:
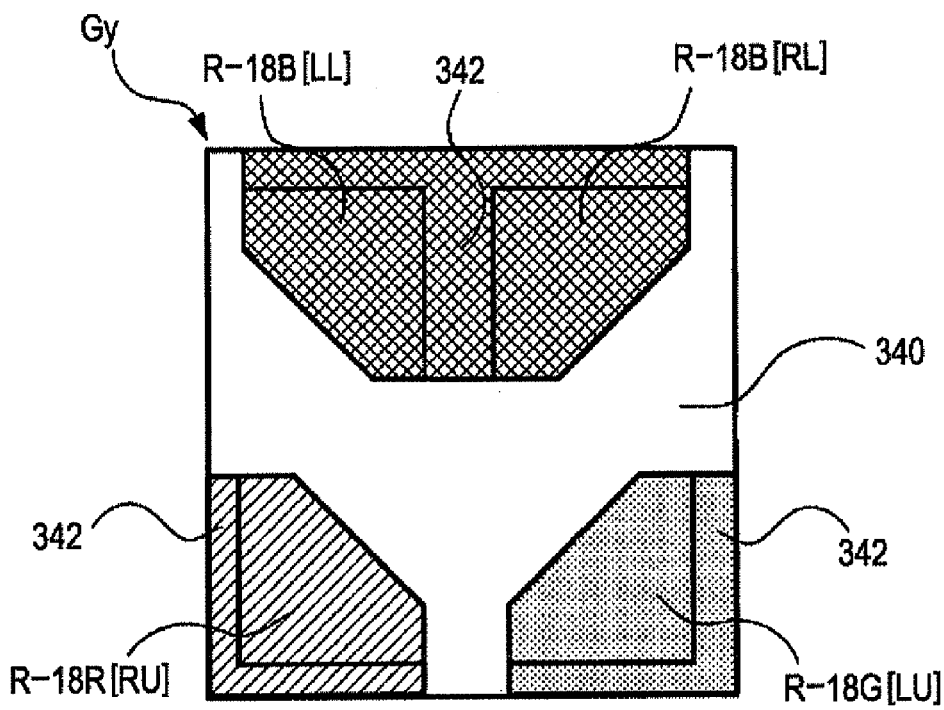
FIG. 6 is an enlarged view of a pixel Gy shown in FIG. 3.

On the premise of the above-described structure, in this embodiment, pixels Gx and Gy as shown in FIGS. 3, 5, and 6 are configured, First, the pixel Gx, as shown in FIGS. 3 and 5, is configured by a pixel electrode 13 (see reference sign R-18R[LL] in FIG. 5), which is located in the left lower part in the figure, of the red opening part R-18R, a pixel electrode 13 (see reference sign R-18G[RL] in FIG. 5), which is located in the right lower part in the figure, of the green opening part R-18G, and pixel electrodes 13 (see reference signs R-18B[LU] and R18B[RU] in FIG. 5), which are located in the left upper part and the right upper part in the figure, of the blue opening parts R-18B.

On the other hand, the pixel Gy, as shown in FIGS. 3 and 6, is configured by a pixel electrode 13 (see reference sign R-18R[RU] in FIG. 6), which is located in the right upper part in the figure, of the red opening part R-18R, a pixel electrode 13 (see reference sign R-18G[LU] in FIG. 6), which is located in the left upper part in the figure, of the green opening part R-18G, and pixel electrodes 13 (see reference signs R-18B [LL] and R-18B[RL] in FIG. 6), which are located in the left lower part and the right lower part in the figure, of the blue opening parts R-18B.

In these pixels Gx and Gy, only the dispositional relationships of the pixel electrode 13 included in the red opening part R-18R and the green opening part R-18G and the pixel electrode 13 included in the blue opening part R-18B are opposite in the vertical direction in the figure. Thus, the pixels Gx and Gy do not have a basic difference in the viewpoint of contribution to image display (in addition, the subscripts "x" and "y" represent distinction in the above-described point of view and are regardless of the order of arrangement of the red opening part R-18R and the green opening part R-18G in the horizontal direction in the figure, See a pixel Gy(s) shown in FIG. 3. Hereinafter, such a pixel Gy(s) is also referred to as a "pixel Gy". This also applies for the "pixel Gx".).

In addition, any of the above-described pixel electrodes 13 is configured as a constituent element of a corresponding individual organic EL element 8 (or the unit circuit P), as described above.

The organic EL device according to this embodiment includes the above-described various elements. However, hereinafter, various elements that have not been described above or supplements for the elements described above will be described.

First, the insulation films 301 and 302 (hereinafter, these may be simply referred to as insulation films 301 and 302) interposed between the above-described first and second layers contribute to prevention of occurrence of a short circuit between conductive elements of the laminated structure 250, implementation of a very appropriate disposition of the conductive elements in the laminated structure 250, or the like.

The insulation films 301 and 302 are formed of various insulation materials having various thicknesses. However, preferably, the thickness and the material that are appropriate are selected based on the dispositional positions and roles of the insulation films in the laminated structure 250. More particularly, it is preferable that the insulation films 301 and 302, for example, are formed of $SiO_2$, SiN, SiON, or the like. Alternatively, the top face of the second interlayer insulation film 302 may be formed of acrylic resin that can be easily formed to be a flat surface, so that a plurality of the pixel electrodes 13 (see FIG. 4) formed to use the second interlayer insulation film 302 as a bottom layer is formed in a same face.

Next, the barrier layer 40 shown in FIG. 4 is formed on the opposing electrode 5, to be described later, so as to cover the entire face of the component substrate 7. This barrier layer 40 has a function for blocking penetration of water and oxygen into the organic EL element 8. In order to exhibit such a function sufficiently, it is appropriate that the barrier layer 40 is, for example, particularly formed of SiN, SiON, $SiO_2$, or the like.

In addition, the opposing electrode 5 shown in FIG. 4 is formed on the light emitting function layer 18 so as to cover the entire face of the component substrate 7. This opposing electrode 5 is formed to be in a rectangular shape (any particular opening or gap is not formed therein, that is, so called solid) in the plan view, and the periphery of the opposing electrode 5 is electrically connected to the power supply line 201 shown in FIG. 1 (the connection is not shown in the figure).

The opposing electrode 5, for example, is formed of a material such as aluminum or silver having a relatively high light-reflecting capability.

Each of the above-described organic EL elements 8 is configured by the above-described opposing electrode 5 and the pixel electrode 13 and the light emitting function layer 18 that are described above.

Based on the above-described structure, for example, the pixel electrode 13 is set to the anode, the opposing electrode 5 is set to the cathode, and the like. Thus, when a current flows between the pixel electrode 13 and the opposing electrode 5, a current simultaneously flows through the light emitting function layer 18, and thereby the light emitting function layer 18 emits light. In such a case, emission of various colors including red, green, and blue colors on the basis of the differences of the above-described organic EL materials is performed. Then, a part of light emitted from the light emitting function layer 18 directly advances outside the organic EL device toward the component substrate 7. The other part advances toward the opposing electrode 5 side, then, is reflected from the opposing electrode 5, and then, advances to the outside of the organic EL device (see reference sign L in FIG. 4). As described above, in this embodiment, the light L advances toward the component substrate 7 side, and thus so-called a bottom-emission type is formed.

Hereinafter, the operations and advantages that are acquired by the above-described organic EL device will be described.

First, according to the organic EL device according to this embodiment, manufacture thereof can be performed in an easy manners and image display with high definition can be performed. The reason is that, in this embodiment, one light emitting function layer 18 is formed to be allocated to each opening part 341 into which four pixel electrodes 13 are inserted, that is, each opening part 341 that can bring a relatively large area. The pixels Gx and Gy of the organic EL device are configured by having each pixel electrode 13 (that is, the organic EL element 8) as a basic unit. By the former, the easiness of manufacture is acquired, and by the latter, the high definition is acquired.

In addition, in this embodiment, among the above-described advantages, the advantage of the easiness in manufacture is achieved more effectively by the following reasons.

(1-1) In this embodiment, all the opening parts 341 have a same area, and all the pitches PL of the opening parts 341 are the same. Accordingly, for forming the light emitting function layer 18, for example, in a case where the above-described liquid droplet coating method (ink jet method) is used, the amount of ejection of ink or the ejection pitch can be uniformly set for the entire surface of the component substrate 7. As described above, since the condition for forming the light emitting function layer 18 can be set uniformly, the easiness in manufacturing the organic EL device can be promoted further.

(1-2) In addition, due to the same reason described in (1-1), for example, in a case where the above-described liquid droplet coating method (ink jet method) is used, there is a high possibility that evaporation of solvent after the liquid droplet coating occurs for the entire surface of the component substrate 7 almost uniformly in the process for forming the light emitting function layer 18, and accordingly, it is possible to improve the quality of the organic EL device finally manufactured and to improve the yield. In this embodiment, in this point of view, the easiness in manufacture of the organic EL device is improved.

(1-3) In addition, according to this embodiment, as described above, the area of the opening part 341 is relatively large, and accordingly, in a case where the liquid droplet coating method (ink jet method) is used, the concentration of solute in the ink can be set to be relatively low. In other words, for effective functioning of the light emitting function layer 18, the effective component, that is, the absolute amount of the solute of the above-described organic EL material and the like should be acquired to be equal to or larger than a predetermined amount. Thus, when the coating area (that is, the area in which the opening part exists) is relatively small, the ratio of the absolute amount to the solvent becomes relatively large. On the other hand, when the coating area is large, the ratio becomes small.

Accordingly, coating of the liquid droplets is performed more appropriately. The reason is that, when the concentration of the solvent is high, clogging of the nozzle can easily occur. However, when the concentration of the solvent is low, the possibility that such inconvenience occurs decreases markedly.

As described above, according to this embodiment, in this point of view, easiness in manufacture of the organic EL device is promoted further.

Figure 7:
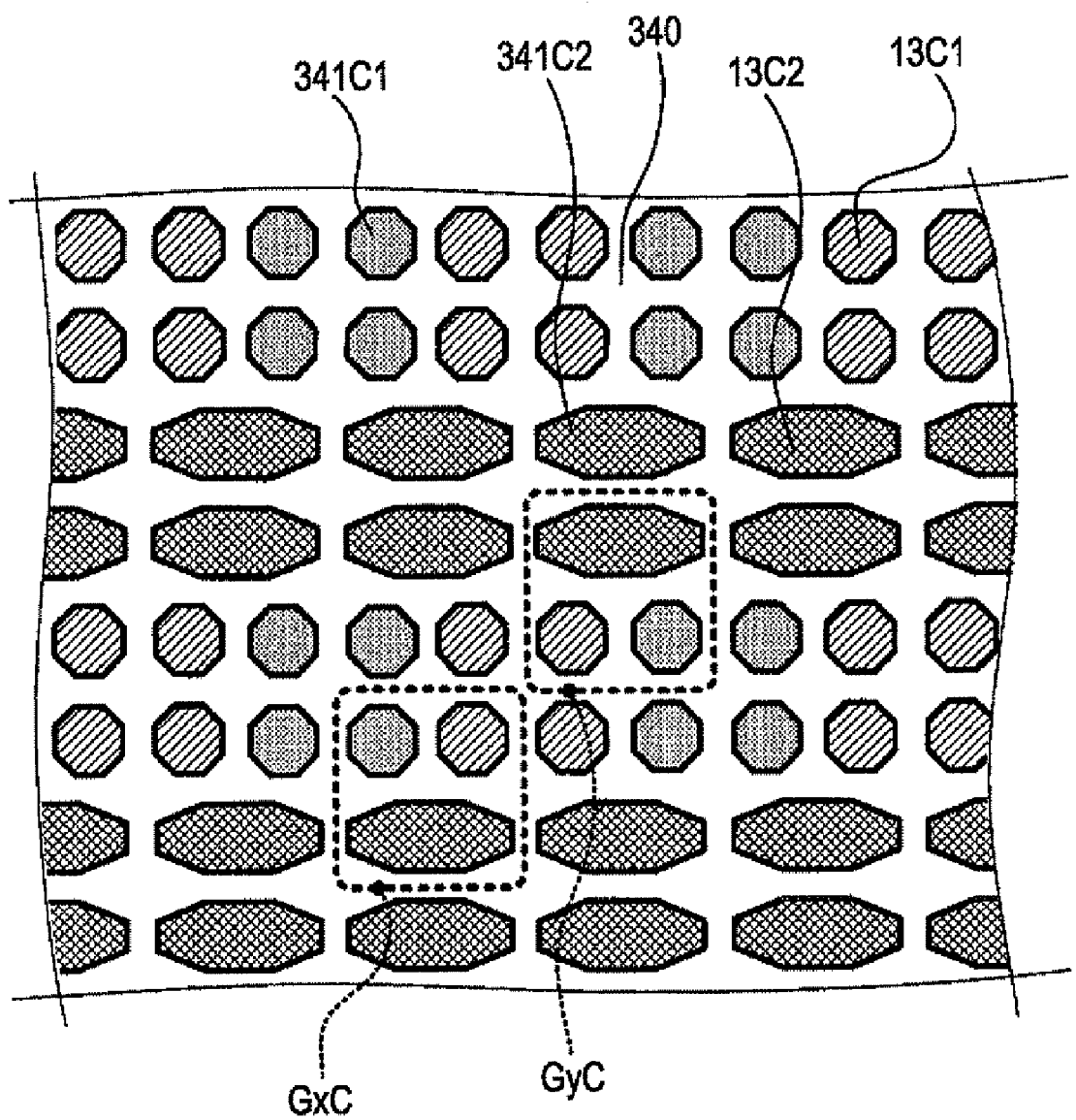
FIG. 7 is a diagram of a same form as that of FIG. 3 and is a comparative example (Comparative Example 1 in which the definition is maintained to be the same as that of the case shown in FIG. 3) of this embodiment.
Figure 8:
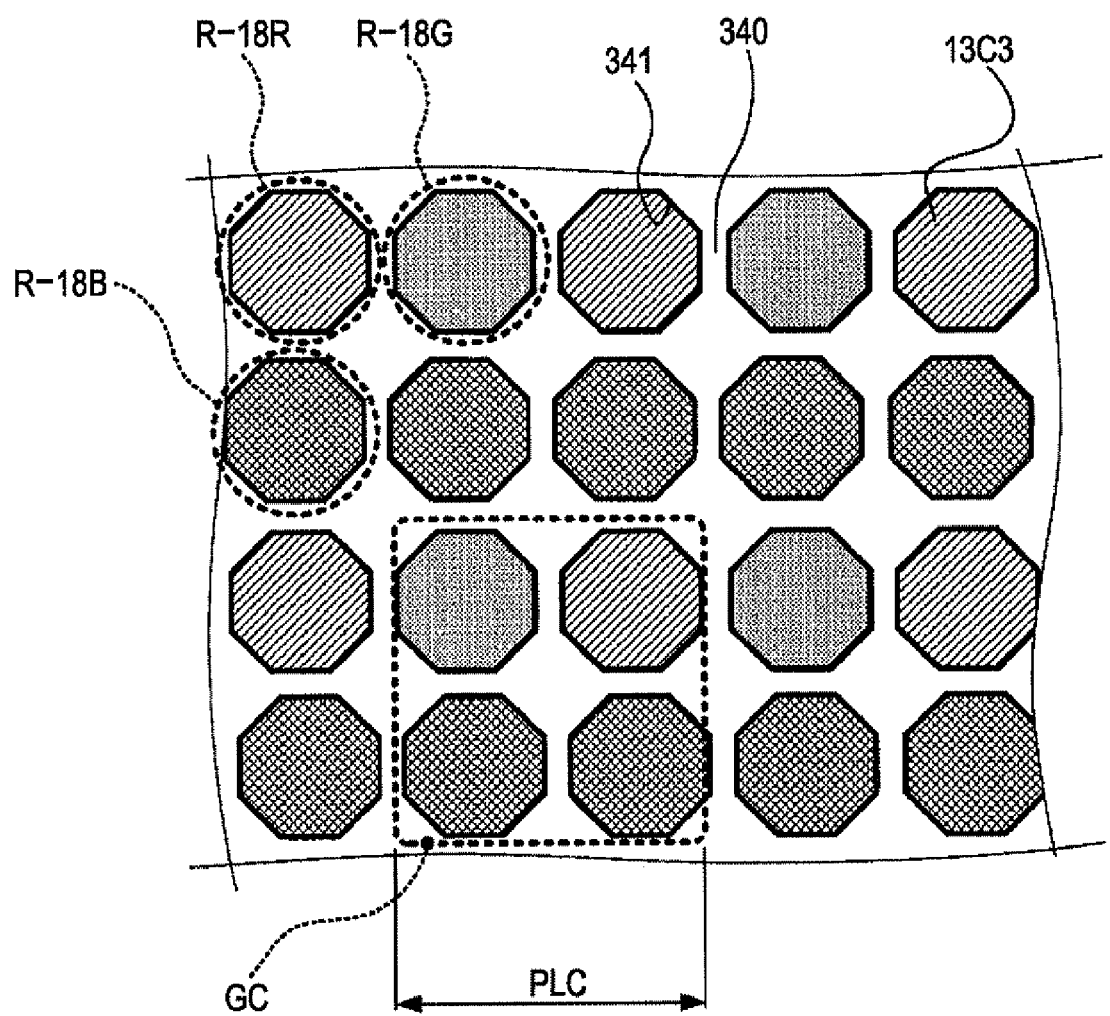
FIG. 8 is a diagram of a same form as that of FIG. 3 and is a comparative example (Comparative Example 2 in which the labor required for manufacture thereof is maintained to be the same as that of the case shown in FIG. 3) of this embodiment.

The above-described advantages can be more clearly acquired by comparing the embodiment with comparative examples shown in FIGS. 7 and 8.

First, FIG. 7 shows an example showing the type of an opening part that is formed by using a general technique in a case where pixels GxC and GyC having the same definition as that of the pixels Gx and Gy shown in FIG. 3 are formed.

In FIG. 7, both the opening parts 341C1 and 341C2 have an octagon shape in the plan view. However, the former one has an area of about ¼ of the total area of the opening part 341 shown in FIG. 3, and the latter one has an area of about ½ of the total area, similarly. In addition, to the opening parts 341C1 and 341C2, the pixel electrodes 13C1 and 13C2 that have the same shapes as those of the opening parts 341C1 and 341C2 are in correspondence. In addition, the opening part 341C1 has a light emitting function layer of which a part emits red light and the other part has a light emitting function layer that emits green light. On the other hand, the opening part 341C2 has a light emitting function layers that emits blue light.

As described above, generally, a technique in which one pixel electrode is used as one unit and an opening part or a light emitting function layer corresponding thereto is disposed can be widely seen.

According to this form, the pixels GxC and GyC having the same definition as that of the pixels Gx and Gy shown in FIG. 3 can be configured assuredly. However, the easiness in manufacture thereof is apparently retreated from the pixels shown in FIG. 3. The reason is that the number of the opening parts 341C1 is theoretically increased to be four times, compared to the total number of the red opening parts R-18R and the green opening parts R-18G, and the size of the opening part 341C1 is decreased to be ¼ (although the number of the opening part 341C2 becomes twice the total number of the blue opening parts R-18B, and the size of the opening part 341C2 becomes ½, the result is similar).

In addition, in the form shown in FIG. 7, the shape of the opening part 341C1 and the shape of the opening part 341C2, or the pitch of the opening parts 341C1 and the pitch of the opening part 341C2 are different from each other. Accordingly, the above-described advantages of (1-1) and (1-2) according to this embodiment cannot be acquired at all or are at least markedly decreased. For example, a case where the opening part 341C2 is formed to have a same shape and a same pitch as those of the opening part 341C1 may be considered. However, in such as case, the number of the opening parts 341C1 is increased further, compared to the above-described case, and a decrease in the size becomes remarkable.

Next, in FIG. 8, a technique in which one pixel electrode 13C3 is used as one unit and the opening part 341 or the light emitting function layer 18 corresponding thereto is disposed is employed, which is the same as in FIG. 7. Accordingly, the configuration shown in FIG. 8 follows the general technique.

However, in FIG. 8, the shape of the opening part 341 is exactly the same as that of FIG. 3, and each opening part 341 is divided into the red opening part R-18R, the green opening part R-18G, and the blue opening part R-18B, which is the same as that of FIG. 3. In this point, the labor for manufacturing the organic EL device of the form shown in FIG. 8 is basically the same as that for manufacturing the organic EL device according to the form shown in FIG. 3 (in addition, while the opening parts 341 are aligned in a zigzag pattern in FIG. 3, the opening parts 341 are not aligned in the zigzag pattern in FIG. 8. However, this does not have a remarkable influence on the labor of manufacture).

However, in FIG. 8, the pixel has to be configured as one denoted by the reference sign "GC" shown in the figure. This is, as described above, the result acquired from following the general technique in which one pixel electrode 13C3 is used as one unit and an opening part 341 corresponding thereto is disposed and planning the labor required for manufacture to be the same as that for the case of FIG. 3. In FIG. 8, the shape of the pixel electrode 13C3 is exactly the same as that of the opening part 341 (both are octagons having a same area), and a plurality of the pixel electrodes 13 is not fitted into the inside of the opening part 341, and accordingly, the above-described pixel GC is configured necessarily for the most of the cases.

In addition, in this point, superiority of this embodiment is confirmed. The reason is that the pixel GC is to be necessarily configured as described above, and thus, the width (a horizontal length in the figure) is, as shown in FIG. 8, "PLC", and the width is twice the width PL of the pixel Gx or Gy shown in FIG. 3 (In other words, PCL=2·PL. In addition, although "PL" is precisely the pitch of the arrangement as described above, this is almost the same as the width of the pixel Gx or Gy as is apparent from FIG. 3). The point is that the case of FIG. 8 has definition lower than that of the case of FIG. 3.

As described above, the organic EL device according to this embodiment can acquire the easiness in manufacture and perform image display with high definition.

(2) Next, according to the organic EL device according to this embodiment, the electrode separating layer 342 is located inside the opening part 341, and accordingly, occurrence of mutual interference (or crosstalk) between the pixel electrodes 13 inside the same opening part 341 can be suppressed to be the minimum. In addition, as described above, by appropriately adjusting the thickness of this electrode separating layer 341, for example, separation of the hole injection layer without separating the organic light emitting layer can be implemented. Accordingly, the improvement of easiness in manufacture that is one of the above-described advantages and the above-described advantage of suppression of the occurrence of mutual interference can be implemented in balance.

(3) In addition, according to the organic EL device of this embodiment, the opening parts 341 or the red opening part R-18R, the green opening part R-18G, and the blue opening part R-18B are arranged in the form as shown in FIG. 3, and accordingly, the pixels Gx and Gy can be more appropriately set.

In other words, generally, in order to perform color display, use of combinations of predetermined colors such as a red color, a green color, a blue color, and the like becomes the premise. In addition, when the colors are assigned to each pixel, the "pixel" is needed to be configured to include at least one of the pixels corresponding to each color. In such a case, it is needed to consider the physical distance between the pixels within the "pixel".

On the above-described premise, it is apparent from FIG. 3 that disposition of the red opening parts R-18R, the green opening parts R-18G, and the blue opening parts R-18B according to this embodiment provides the most appropriate example. In FIG. 3, since the form in which the red opening parts R-18R and the green opening parts R-18G are alternately arranged and the blue opening parts R-18B are arranged in rows adjacent to the rows in which the red opening parts R-18R and the green opening parts R-18G are aligned is used, the pixels Gx and Gy can be naturally configured to include a total of the red, green, and blue pixel electrodes 13. In addition, for the same reason, the pixels Gx and Gy are aligned densely without forming any extra area such as a gap therebetween.

As described above, according to this embodiment, the total "pixels" can be more appropriately disposed, configured, or set for the entire surface of the component substrate 7.

In addition, fitting four pixel electrodes 13 into one opening part 341 in this embodiment markedly contributes to the implementation of the above-described advantages. Accordingly, two pixel electrodes 13 that occupy an upper half part in the figure inside the opening part 341 and two pixel electrodes 13 that occupy a lower half part inside another opening part 341 can be arranged as "one pixel" and the principle of this configuration can be applied to all the "pixels" positioned inside the image display area 7a. Accordingly, the appropriateness, accuracy, easiness, and the like of the configuration of the pixels Gx and Gy are acquired.

Although the embodiment of the invention has been described as above, the light emitting device according to an embodiment of the invention is not limited thereto, and various modified examples described below may be employed.

(1) In the above-described embodiment, as described with reference to FIG. 3, the opening parts 341 are aligned in a zigzag pattern. However, the invention is not limited thereto.

MODIFIED EXAMPLE 1

Figure 9:
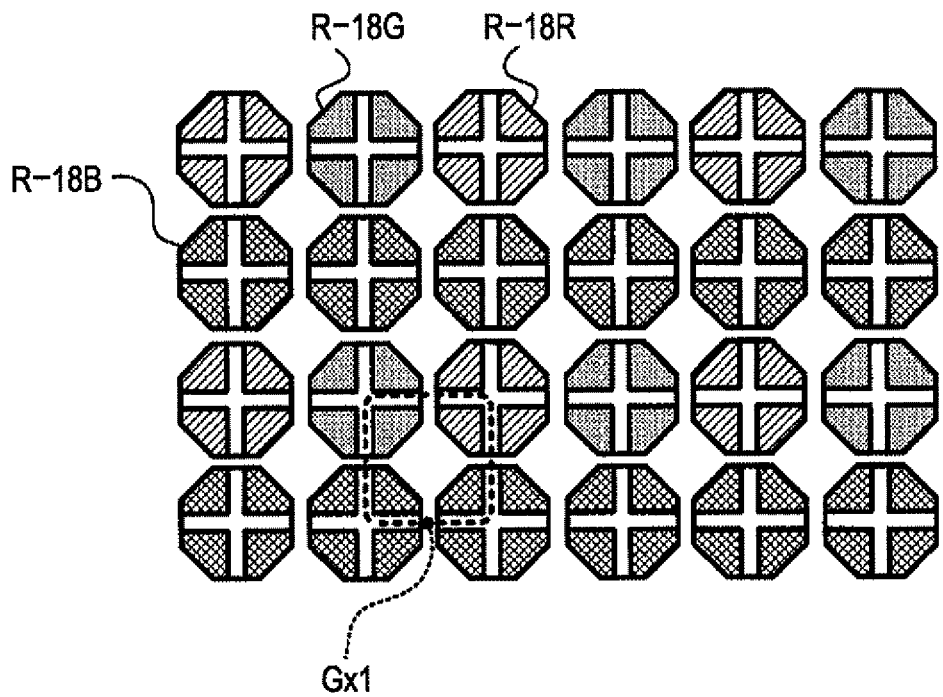
FIG. 9 is a diagram of a same form as that of FIG. 3 and is a Modified Example 1 (arrangement of a rectangular state) of this embodiment.

For example, as shown in FIG. 9, the red opening parts R-18R, the green opening parts R-18G, and the blue opening parts R-18B may be arranged so as to form a precise rectangular state. In such a case, the pixel Gx1 corresponding to the pixel Gx shown in FIG. 3 is configured as shown in FIG. 9 (the pixel corresponding to the "pixel Gy" is not shown in the figure. This applies to each drawing (excluding FIG. 13) according to modified examples 2 to 6).

MODIFIED EXAMPLE 2

Figure 10:
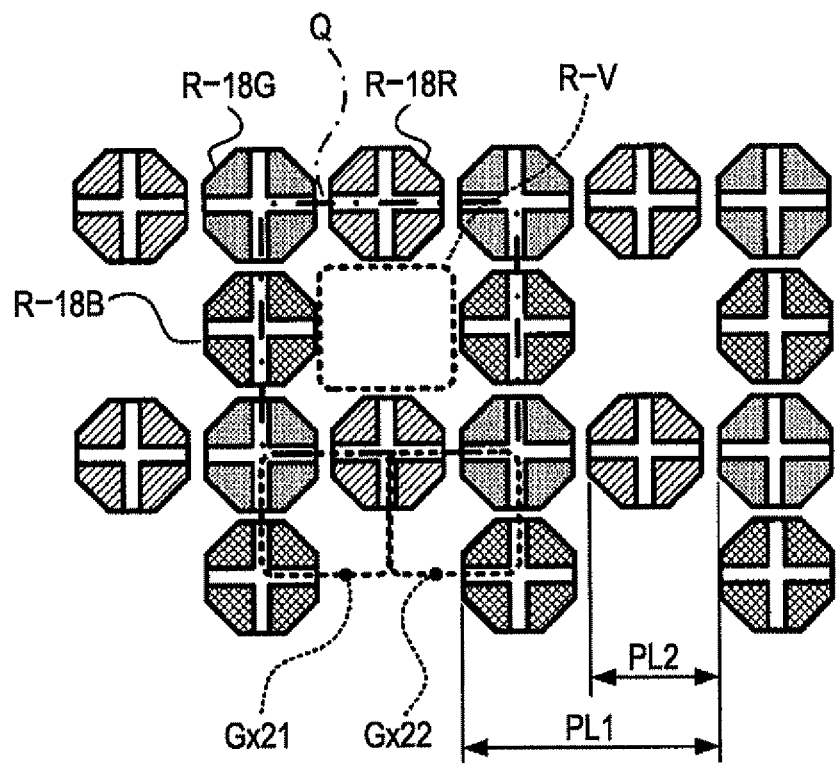
FIG. 10 is a diagram of a same form as that of FIG. 3 and is a Modified Example 2 (having a blank area) of this embodiment.

Alternatively, the red opening parts R-18R, the green opening parts R-18G, and the blue opening parts R-18B may be arranged as shown in FIG. 10. In FIG. 10, the red opening parts R-18R and the green opening parts R-18G are arranged in every other row and are alternately arranged along the direction of the row, which is not different from the configuration of FIG. 3. In addition, the blue opening parts R-18B are aligned in rows adjacent to the rows in which the red opening parts R-18R and the green opening parts R-18G are aligned, which is the same as that of FIG. 3.

However, in FIG. 10, the blue opening parts R-18B are arranged in every other position along the direction of the row. In other words, since the blue opening parts R-18B are aligned to have an arrangement pitch of PL1, the red opening parts R-18R and the green opening parts R-18G are aligned to have an arrangement pitch of PL2 (here, PL2=(½)·PL1). Accordingly, in the form shown in FIG. 10, between the blue opening parts R-18B a gap area R-V is formed. In this gap area R-V, any opening part is not included, and thus, any pixel electrode 13 or the organic EL element 8 is not included. Therefore, the gap area R-V is not related with any light emitting phenomenon at all.

When the gap area R-V is included, the following advantages are acquired.

In the gap area R-V, the circuit element thin film 11 as described with reference to FIG. 4 can be formed in a concentrative manner. Here, "in a concentrative manner" means that all the circuit element thin films 11 of the total 12 organic EL elements 8 in an area surrounded by a dashed dotted line, for example, denoted by a reference sign Q shown in FIG. 10 are formed in the gap area R-V.

The circuit element thin film 11 may include a thin film transistor and the like as described above, and thus, basically, the circuit element thin film 11 should be formed within the area for forming the partition wall layer 340. In this point of view, for example, for a case of the above-described Modified Example 1, a slightly dense disposition form for formation of the circuit element thin film 11 should be considered (see FIG. 9). However, in this Modified Example 2, it is possible to form the circuit element thin films 11 with a relatively large margin "in the concentrative manner", as described above additionally, In addition, in FIG. 10, a pixel corresponding to the pixel Gx shown in FIG. 3, as shown in FIG. 10, is configured by two different forms of pixels Gx21 and Gx22 This also applies to a pixel corresponding to the "pixel Gy". Here, the "different forms" are identified based on positioning of the gap area R-V in the pixel, as is apparent from the figure.

(2) In the above-described embodiment, as described with reference to FIG. 3, the opening part 341 has an octagon shape in the plan view, and the pixel electrode 13 has a rough right triangle shape. However, the invention is not limited thereto.

MODIFIED EXAMPLE 3

Figure 11:
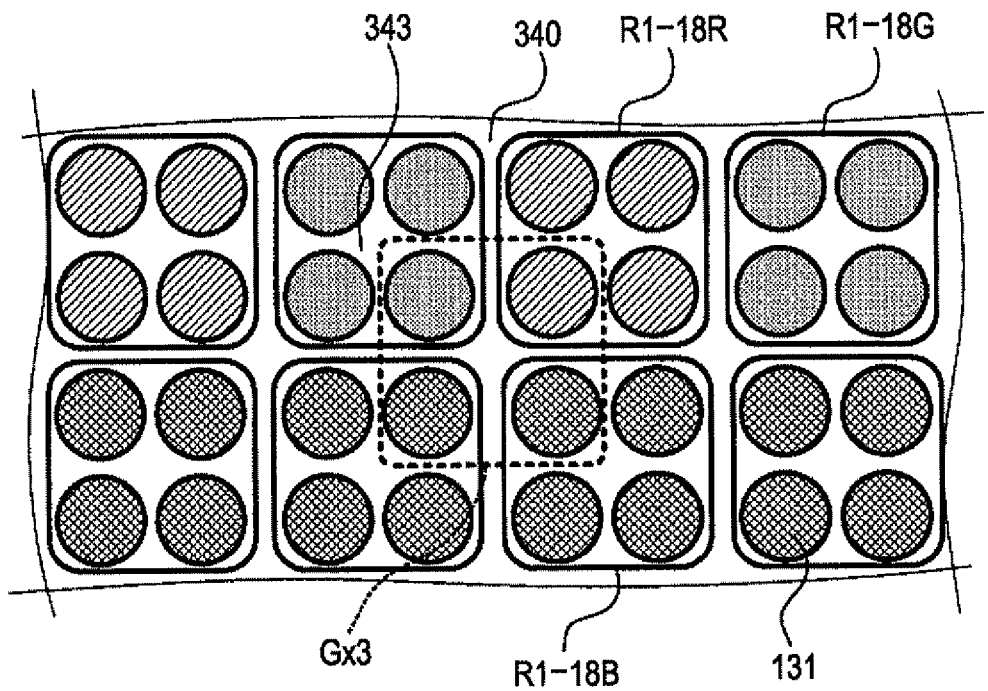
FIG. 11 is a diagram of a same form as that of FIG. 3 and is a Modified Example 3 (the opening part has a quadrilateral shape) of this embodiment.

For example, the "opening part" and the "pixel electrode" according to an embodiment of the invention may have shapes as shown in FIG. 11. In FIG. 11, the red opening part R1-18R, the green opening part R1-18G, and the blue opening part R1-18B have an approximate quadrilateral shape. However, each corner of the quadrilateral shape is formed to be round. On the other hand, the pixel electrode 131 has an approximately precise circular shape.

In addition, the shape of the electrode separating layer 343 in the plan view is as shown in FIG. 11 in accordance with the relationship between the shapes of the opening parts R1-18R, R1-18G, and R1-18B and the shape of four pixel electrodes 131 that are aligned for each opening part. In addition, in FIG. 11, a pixel Gx3 corresponding to the pixel Gx shown in FIG. 3 is configured as shown in FIG. 11.

MODIFIED EXAMPLE 4

Figure 12:
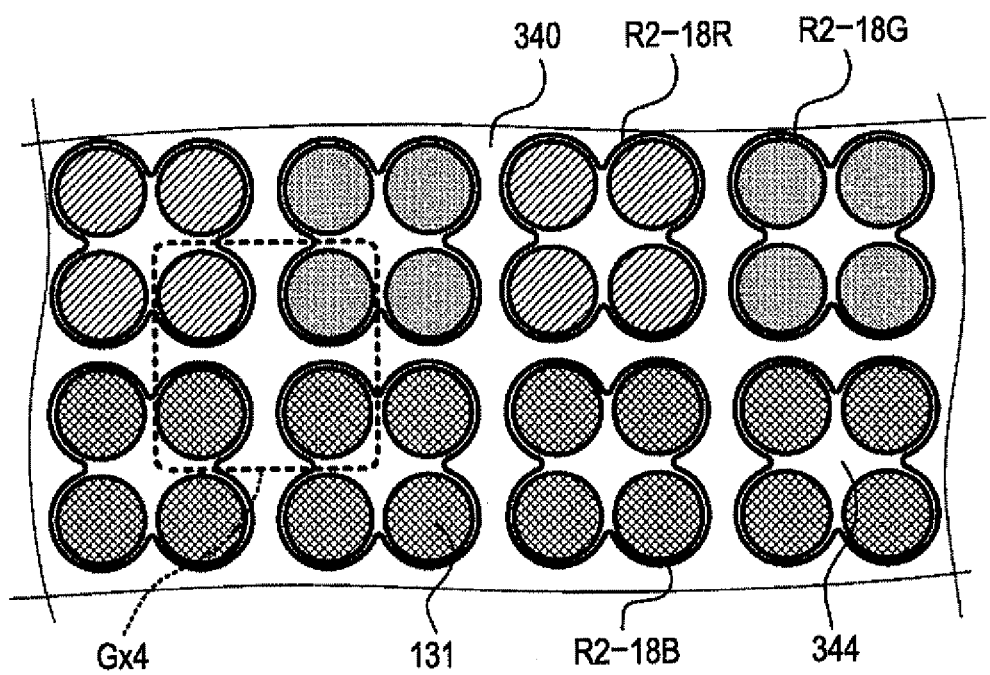
FIG. 12 is a diagram of a same form as that of FIG. 3 and is a Modified Example 4 (the opening part has a clover shape) of this embodiment.

Alternatively, the "opening part" and the "pixel electrode" according to an embodiment of the invention may have shapes as shown in FIG. 12. In FIG. 12, the pixel electrode 131 has an approximately precise circular shape, which is not different from that shown in FIG. 11.

However, in FIG. 12, each of the red opening part R2-18R, the green opening part R2-18G, and the blue opening part R2-18B has the shape of an outline that follows the outline of four pixel electrodes 131 as possibly as can be (this may be also named as a so-called "clover shape" having four leaves). In other words, a side wall of the partition wall layer 340 breaks between the pixel electrodes 131 that are aligned vertically or horizontally in the figure. Accordingly, when viewed in a plane as shown in FIG. 12, the degree of closeness between the contour (this is the same as the contour of the opening part R2-18R and the like) of the side wall and the contour of the pixel electrode 131 becomes higher than that shown in FIG. 11.

In addition, the shape of the electrode separating layer 344 in the plan view is as shown in FIG. 12 in accordance with the relationship between the shape of each of the opening parts R1-18R, R1-18G, and R1-18B and the shape of four pixel electrodes 131 that are aligned for each opening part. In addition, in FIG. 12, a pixel Gx4 corresponding to the pixel Gx shown in FIG. 3 is configured as shown in FIG. 12.

As the modified examples 3 and 4, when the shape of the opening part is round, stay of liquid droplets or ink droplets within the opening part can be appropriately implemented in a case where the light emitting function layer 18 is formed by using the liquid droplet coating method (ink jet method). In other words, the liquid droplets or the ink droplets have a predetermined surface tension, and thus, for example, when the shape of the opening part is angled, it is difficult to penetrate the liquid droplets or the ink droplets into the corner part. However, in these modified examples 3 and 4, the occurrence of such inconvenience is prevented in advance.

In addition, in the above-described embodiment, the shape of the opening part 341 is an octagon shape and has angles. However, all the inner angles are obtuse angles, and accordingly, approximately the same advantages as described above can be acquired.

In addition, in order to improve the advantages further, the side wall face of the partition wall layer 340 may be formed to have a liquid repellent property or an ink repellent property, for example, by performing an atmosphere-pressure plasma process or the like for the side wall. In such a case, ink ejected into the opening part tends to be spaced apart from the side wall, and accordingly, the stay of the liquid droplets or the ink droplets in the opening part can be implemented well.

(3) In the above-described embodiment, as described with reference to FIG. 3, a form in which four pixel electrodes 13 are fitted into one opening part 341 is used. However, the invention is not limited to such a form.

MODIFIED EXAMPLE 5

Figure 13:
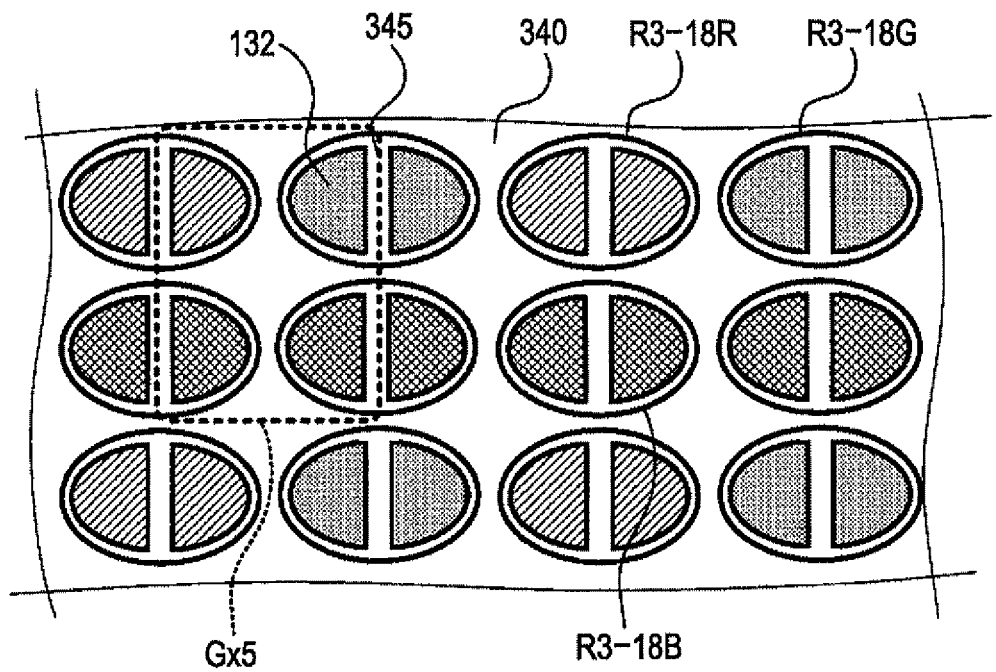
FIG. 13 is a diagram of a same form as that of FIG. 3 and is a Modified Example 5 (two pixel electrodes are fitted into the opening part) of this embodiment.

For example, as shown in FIG. 13, a form in which two pixel electrodes 132 are placed into one opening part R3-18R, R3-18G, or R3-18B is within the scope of the invention.

In particular, in FIG. 13, the opening parts R3-18R, R3-18G, and R3-18B have an oval shape in the plan view. On the other hand, the pixel electrode 132 has an approximate half-oval shape. Two pixel electrodes 132 are disposed such that diameter portions of the approximate half-oval shapes face each other. Into the opening parts R3-18R, R3-18G, and R3-18B, the two pixel electrodes 132 disposed as described above are fitted.

In addition, the shape of the electrode separating layer 345 in the plan view is as shown in FIG. 13 in accordance with the relationship between the shape of each of the opening parts R3-18R, R3-18G, and R3-18B and the shape of two pixel electrodes 132 aligned for each one opening part. In addition, in FIG. 13, a pixel Gx5 corresponding to the pixel Gx shown in FIG. 3 is configured as shown in FIG. 13. In addition, in the configuration of the pixels shown in FIG. 13, the blue opening part R3-18B is located on the lower side in the figure all the time, and the red opening part R3-18R and the green opening part R3-18G are located on the upper side in the figure. Accordingly, a pixel corresponding to the pixel Gy in FIG. 3 does not exist.

As described above, basically, the number of the pixel electrodes fitted into one opening part is not limited according to an embodiment of the invention. However, as can be estimated from the above-described Modified Example 5, the above-described embodiment and Modified Examples 1 to 4, in order to appropriately configure the "pixel", generally, it is preferable that even pixel electrodes are configured to be fitted into one opening part.

(4) In the above-described embodiment, as described with reference to FIG. 3, all the opening parts 341 have a same shape. However, the invention is not limited thereto.

MODIFIED EXAMPLE 6

Figure 14:
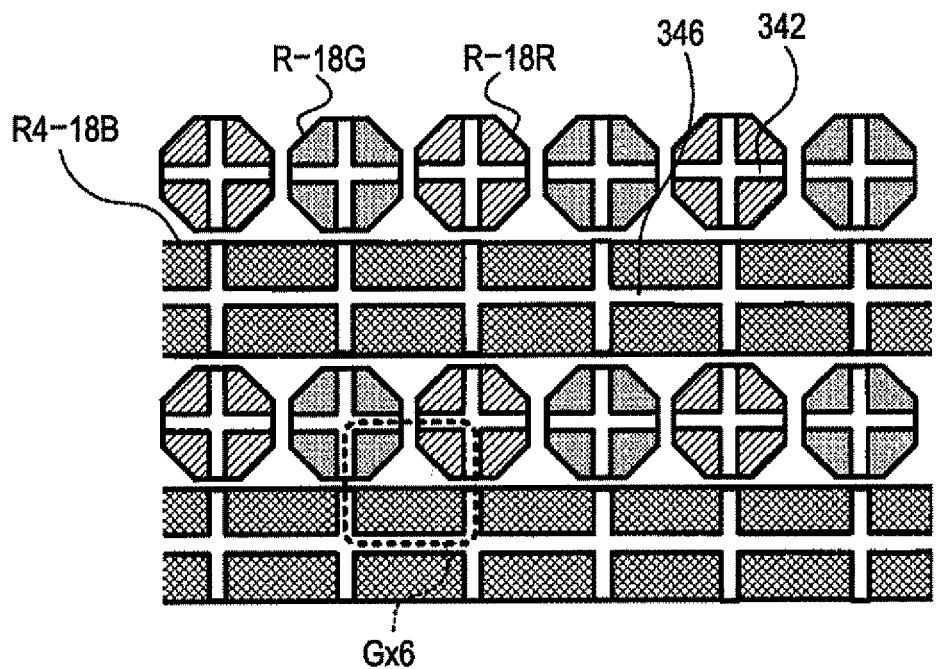
FIG. 14 is a diagram of a same form as that of FIG. 3 and is a Modified Example 6 (there is a series of the opening parts in the direction of a row) of this embodiment.

For example, the "opening part" described in an embodiment of the invention may have a shape as shown in FIG. 14. In FIG. 14, the red opening part R-18R and the green opening part R-18G are alternately arranged in every other row along the direction of the row, which is not different from the configuration shown in FIG. 3. In addition, similarly, the blue opening parts R4-18B are located in a row adjacent to the rows in which the red opening parts R-18R and the green opening parts R-18G are aligned.

However, the blue opening parts R4-18B are a series of opening parts disposed along the direction of the row, In other words, the blue opening parts R4-18B have a shape in which the opening parts R-18B that are separated from one another as shown in FIG. 3 are formed as one string.

In addition, the shape of the electrode separating layer 346 inside the blue opening part R4-18B in the plan view, as shown in FIG. 13, is in the shape in which the shape of a cruciform is connected to a horizontal line. In addition, in FIG. 14, a pixel Gx6 corresponding to the pixel Gx shown in FIG. 3 is configured as shown in FIG. 14, According to this form, it is possible to more effectively implement improvement of the easiness in manufacture that is an advantage according to the above-described embodiment. The reason is that, in such a case, the light emitting function layer in the opening part R4-18B can be formed by performing ink ejection altogether or performing ink ejection at least a number of times that is smaller than the number of times of ink ejection corresponding to the total number of the red opening parts R-18R and the green opening parts R-18G.

In addition, the following modified examples other than the above-described examples are also within the scope of the invention.

(5) The organic EL device according to the above-described embodiment is a bottom-emission-type. However, the invention is not limited thereto. Thus, the invention may also be applied to either a top-emission-type or a dual-emission-type.

In addition, when the top-emission-type is used, a reflective layer that has the light emitted from the light emitting function layer 18 progress to the side opposite to the component substrate 7 is needed. This reflective layer, for examples as long as the configuration shown FIG. 4 is premised, is formed on the first interlayer insulation film 301 and under the second interlayer insulation film 302 and is formed to be in correspondence with the area for forming the pixel electrode 13. In addition, in this case, the component substrate 7 may be formed of an opaque material such as ceramic or metal (to the contrary, for the bottom-emission type, the component substrate 7 is needed to be formed of a transparent material). In addition, the opposing electrode 5 is formed of a transparent material.

Figure 15:
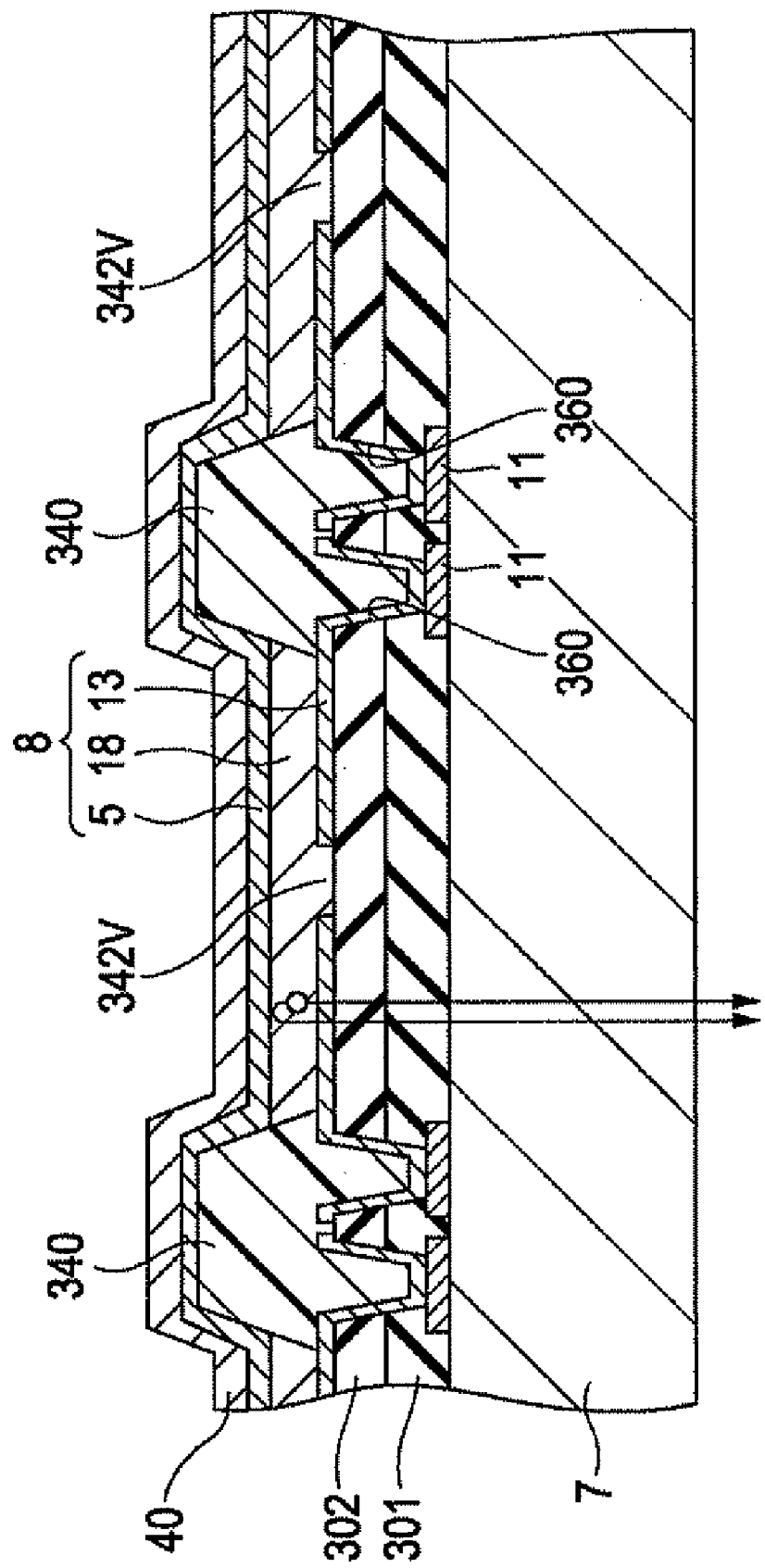
FIG. 15 is a diagram of a same form as that of FIG. 4 and is a diagram showing a case where an electrode separating layer is not included.

(6) In the above-described embodiment, the electrode separating layer 342 is formed. However, the invention is not limited thereto. For example, as shown in FIG. 15, an organic EL device having the structure in which no element is formed in the position of the electrode separating layer 342 in FIG. 4 and only separation (see reference sign "342 V" in the figure) between the pixel electrodes 13 is implemented is within the scope of the invention.

(7) In the above-described embodiment, a case where the liquid droplet coating method (ink jet method) is used for forming the light emitting function layer 18 has been mainly described. However, the invention is not limited thereto. For example, when the effective component such as the above-described organic EL material is formed of a low-molecular material, the light emitting function layer may be formed by using a vapor deposition method such as a CVD method that is well known generally. In such a case, the light emitting function layer, under the premise of the configuration shown in FIG. 4, similar to the opposing electrode 5, may be formed so as to cover the entire surface of the component substrate 7. In other words, the light emitting function layer may be disposed in a space surrounded by the side walls of the partition wall layer 340 or may be disposed so as to cover the entire partition wall layer 340. Nevertheless, even in such a case, a structure in which the light emitting function layer is disposed in correspondence with each opening part 341 appears, which is not different from the above-described embodiment. Thus, such a form is not beyond the scope of the invention. In an embodiment of the invention, the representation (particularly, "to be assigned") that one light emitting function layer is formed to be assigned to each opening part includes the above-described case.

Application

Figure 16:
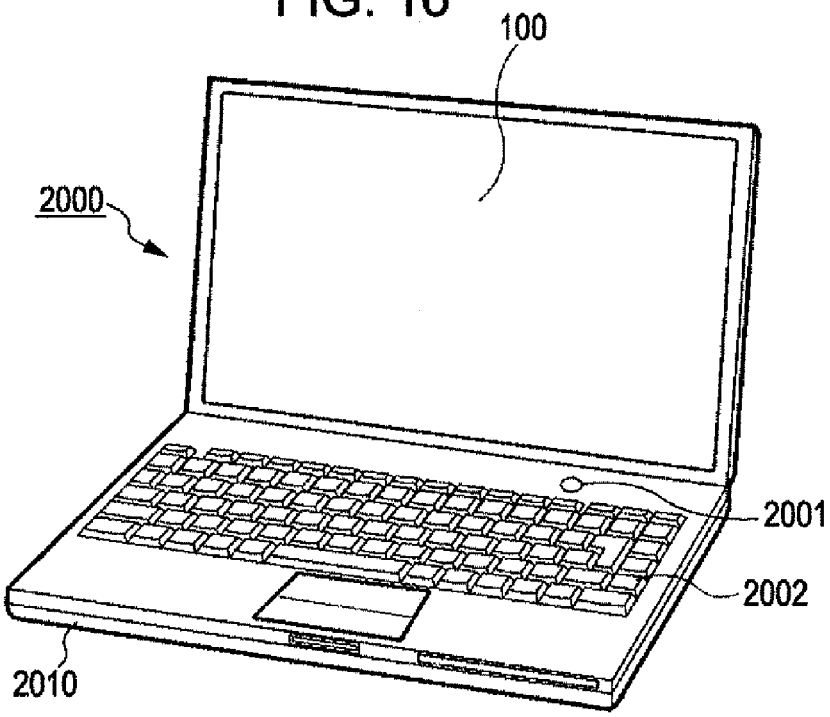
FIG. 16 is a perspective view showing an electronic apparatus in which an organic EL device according to an embodiment of the invention is used.

Next, an electronic apparatus to which the organic EL device according to an embodiment of the invention is used will be described. FIG. 16 is a perspective view showing the configuration of a mobile-type personal computer using the organic EL device according to the above-described embodiment as an image display apparatus. The personal computer 2000 includes an organic EL device as a display device and a main unit 2010. In the main unit 2010, a power switch 2001 and a keyboard 2002 are disposed.

Figure 17:
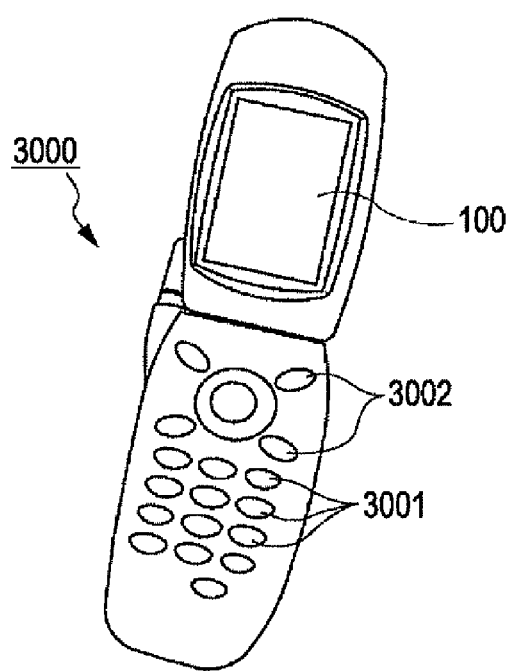
FIG. 17 is a perspective view showing another electronic apparatus in which an organic EL device according to an embodiment of the invention is used.

FIG. 17 shows a cellular phone to which the organic EL device according to the above-described embodiment is applied. The cellular phone 3000 includes a plurality of operation buttons 3001, a plurality of scroll buttons 3002, and the organic EL device 1 as a display device. By operating the scroll button 3002, a screen displayed in the organic EL device is scrolled.

Figure 18:
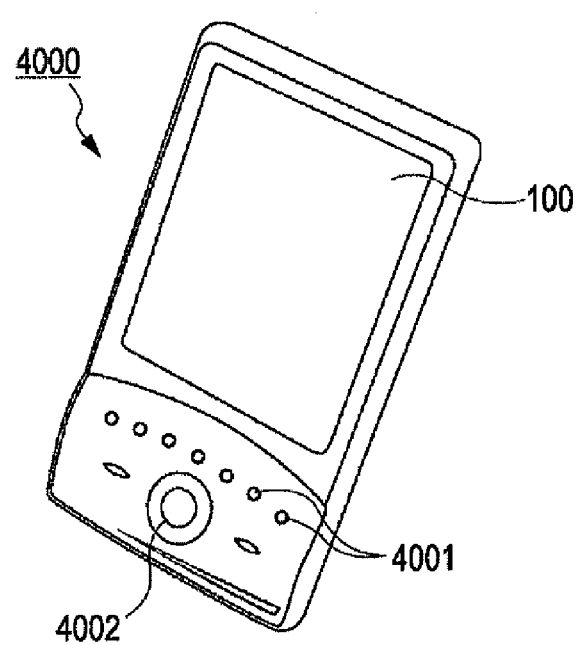
FIG. 18 is a perspective view showing still another electronic apparatus in which an organic EL device according to an embodiment of the invention is used.

FIG. 18 shows a personal digital assistant (PDA) to which the organic EL device according to the above-described embodiment is applied. The personal digital assistant 4000 includes a plurality of operation buttons 4001, a power switch 4002, and the organic EL device as a display device. By operating the power switch 4002, various information such as an address list or a scheduler is displayed in the organic EL device.

As electronic apparatuses to which the organic EL device according to the above-described embodiment is applied, there are a digital still camera, a television set, a video camera, a car navigation system, a pager, an electronic organizer, an electronic paper sheet, a calculator, a word processor, a workstation, a television phone, a POS terminal, a video player, an apparatus having a touch panel, and the like, other than the electronic apparatuses shown in FIGS. 16 to 18.

The entire disclosure of Japanese Patent Application No. 2008-024957, filed Feb. 5, 2008 is expressly incorporated by reference herein.

What is claimed is:

1. A light-emitting device, comprising:
  a substrate;
  a plurality of light-emitting elements formed on the substrate in a matrix; and
  a partition wall layer formed on the substrate so as to form a plurality of opening parts in plan view, adjacent partitions of the partition wall layer forming one opening part of the plurality of opening parts;
  each of the light-emitting elements including a pixel electrode, an opposite electrode, and a light-emitting function layer sandwiched between the pixel electrode and the opposite electrode;
  the light-emitting function layers being formed such that one of the light-emitting function layers is assigned to each of the opening parts, and the pixel electrodes being formed such that a plurality of the pixel electrodes are stored in each of the opening parts;

the plurality of opening parts being grouped into a plurality of opening part groups and aligned according to an arrangement in the matrix;

from among the plurality of opening part groups,
- a first opening part group having a plurality of first opening parts in which a first color light-emitting function layer is arranged;
- a second opening part group having a plurality of second opening parts in which a second color light-emitting function layer is arranged; and
- a third opening part group having a plurality of third opening parts in which a third color light-emitting function layer is arranged;

the first opening parts and the second opening parts being alternately arranged along a first direction;

the third opening parts being adjacent to a row in which the first opening parts and the second opening parts are arranged, the third opening parts being arranged along the first direction; and one pixel being constituted by a first pixel electrode stored in a first opening part of the first opening parts, a second pixel electrode stored in a second opening part of the second opening parts, and third and fourth pixel electrodes stored in one third opening part of the third opening parts.

2. The light-emitting device as set forth in claim 1, further comprising:
   an electrode separation layer between the plurality of pixel electrodes stored in each of the opening parts.

3. The light-emitting device as set forth in claim 1,
   the light-emitting function layers being formed using a liquid drop coating method.

4. The light-emitting device as set forth in claim 3,
   among the plurality of opening parts, a pitch between two arbitrary opening parts adjacent to each other being the same.

5. The light-emitting device as set forth in claim 1,
   the opening part being provided with a shape with no angle in plan view, or a shape in which each internal angle is obtuse.

6. An electronic device, comprising the light-emitting device as set forth in claim 1.

* * * * *